United States Patent
Galburt et al.

Patent Number: 5,966,216
Date of Patent: Oct. 12, 1999

[54] ON-AXIX MASK AND WAFER ALIGNMENT SYSTEM

[75] Inventors: Daniel N. Galburt, Wilton, Conn.; David M. Williamson, West Malvern, United Kingdom

[73] Assignee: SVG Lithography Systems, Inc., Wilton, Conn.

[21] Appl. No.: 08/793,069

[22] PCT Filed: Oct. 11, 1994

[86] PCT No.: PCT/US94/11506

§ 371 Date: Feb. 14, 1997

§ 102(e) Date: Feb. 14, 1997

[87] PCT Pub. No.: WO96/11376

PCT Pub. Date: Apr. 18, 1996

Related U.S. Application Data

[63] Continuation-in-part of application No. 08/046,038, Apr. 12, 1993, abandoned.

[51] Int. Cl.[6] ................................................. G01B 11/00
[52] U.S. Cl. .............................................................. 356/401
[58] Field of Search ..................................... 356/399–401; 200/548, 559.3

[56] References Cited

U.S. PATENT DOCUMENTS

| | | |
|---|---|---|
| 4,023,126 | 5/1977 | Schlafer . |
| 4,631,416 | 12/1986 | Trutna, Jr. . |
| 4,697,087 | 9/1987 | Wu . |
| 4,829,193 | 5/1989 | Nishi . |
| 4,953,960 | 9/1990 | Williamson . |
| 5,048,968 | 9/1991 | Suzuki . |
| 5,171,999 | 12/1992 | Komatsu et al. . |
| 5,481,362 | 1/1996 | Van Den Brink et al. ............. 356/401 |

*Primary Examiner*—K P Hantis
*Attorney, Agent, or Firm*—Fattibene & Fattibene; Paul A. Fattibene; Arthur T. Fattibene

[57] ABSTRACT

An on-axis through the lens optical alignment system for use in semiconductor manufacturing using step and scan photolithographic techniques. An optical alignment system uses a partially common path with the projection optics (16) optical axis (38) in order to detect alignment targets on a wafer (10) and a mask (20). The relative position of the mask (20) and wafer (10) is detected during a single simultaneous scan, and the mask (20) and wafer (10) are resultantly aligned. This provides advantages over prior art multiple channel off-axis through the lens alignment systems and single channel non-through the lens alignment systems. A detailed optical apparatus (60) is disclosed.

17 Claims, 8 Drawing Sheets

ON-AXIX MASK AND WAFER ALIGNMENT SYSTEM

RELATED APPLICATION

This is a continuation-in-part of copending U.S. application Ser. No. 08/046,038, filed on Apr. 12, 1993, now abandoned.

FIELD OF THE INVENTION

The present invention relates generally to semiconductor manufacturing, and more particularly to an optical alignment system used to align a mask and wafer in a step and scan type lithographic device as used in semiconductor manufacturing.

BACKGROUND OF THE INVENTION

The manufacture of semiconductor circuits or chips having electronic circuits formed thereon is primarily accomplished with photolithographic techniques. During this manufacturing process, successive layers of circuit patterns are formed onto a semiconductor wafer by projecting the image of a mask containing the circuit patterns thereon onto a wafer having a photosensitive resist coating. The feature sizes of the circuit elements formed on the semiconductor wafer are typically in the range of 0.50 microns. This extremely small feature size, in combination with the required multiple layer used in forming a semiconductor chip, necessitates the use of very accurate alignment systems to align the wafer and mask.

One such alignment system is disclosed in U.S. Pat. No. 4,697,087 entitled "Reverse Dark Field Alignment System for Scanning Lithographic Aligner" issuing to Frederick Y. Wu on Sep. 29, 1987, which is hereby incorporated by reference. Therein disclosed is an alignment system wherein a wafer having a wafer target thereon and a mask having a mask target thereon are aligned with respect to each other. The alignment system has two optical channels or arms used to detect alignment targets in scribe alleys above and below the mask pattern being imaged on the semiconductor wafer. A portion of the light path used in the two optical channels or arms is through the projection optics. This path is not on the optical axis of the projection optics, but is off axis. The optical alignment channels or arms are additionally movable to accommodate different projection field heights. This system is referred to as an off axis through the lens alignment system. While an off axis alignment system has several advantages, it is complex and requires correction due to off axis lateral color aberrations in the projection optics. This adjustment for off axis color aberrations must be periodically recalibrated and adjusted for different optical alignment channel or arm positions.

FIG. 1 is a simplified schematic illustration of the alignment system disclosed in U.S. Pat. No. 4,697,087. A wafer 10 is movable in both X-Y directions by wafer stage 12. Wafer stage 12 has adjacent and attached thereto an autocalibration detector 14. A mask 20 is attached to a mask stage 22. The mask stage 22 typically moves along a single axis in a plane parallel to that of the movement of wafer stage 12. This is typically in the Y direction. Between the wafer 10 and mask 20 is positioned projection optics 16. The projection optics 16 image the mask 20 onto portions of the wafer 10. The illumination system for imaging the mask 20 onto the wafer 10 is not illustrated and does not form a part of this invention.

Also between the mask 20 and the wafer 10 is a beamsplitter 18. Associated with the beamsplitter 18 are two alignment channels. One channel is formed by first channel alignment optics 26, first channel illumination source 28, and wafer target detector 29. The second alignment channel is formed by second channel alignment optics 30, second channel alignment illumination source 32, and wafer target detector 33. The first alignment channel has an optical axis 34 and the second alignment channel has an optical axis 36. Both the alignment channels are off the axis of the projection optics. The optical axis of the projection optics is illustrated by line 38. The alignment channel illumination paths follow a special path through the projection optics corrected at visible alignment wavelengths. Each alignment channel in combination with mask target detector 24 is capable of detecting the location of both wafer and mask alignment targets while the wafer and mask are simultaneously scanned. During a single alignment scan, the relative position between a series of wafer and mask targets located in scribe alleys at both the top and bottom of a field are measured. Multiple wavelengths of the alignment illumination must be optically separated with each color collected on a separate photo detector. The alignment shifts due to off-axis lateral color aberrations are corrected after alignment data is collected. The visible light path of the alignment illumination must be corrected over the full field height. Because the two optical alignment channels are movable to accommodate different field heights, an autocalibration detector 14 must be mounted on the wafer stage and is used to periodically measure the offsets between the visible light alignment channel paths and the actinic exposure projection optics path for different channel positions, and alignment wafer lengths. Mask target detector 24 is used to detect the targets on the mask 20, and may be used in combination with wafer target detectors 29 and 33. The operation of this off-axis through the lens alignment system is controlled by control means 39.

FIG. 2 illustrates another prior art alignment system. This optical alignment system is very similar to that disclosed in FIG. 1, with the exception that a single channel non-through the lens optical alignment system is used. The non-through the lens alignment system in FIG. 2 is illustrated by alignment illumination source 40, wafer target detector 41, and alignment optics 42. The single channel alignment system has an alignment optical axis 44. The single channel optical alignment system is mounted adjacent the projection optics 16. The position of wafer targets on wafer 10 is measured when the wafer is moved in position in the field of the alignment system and scanned by movement of wafer stage 12. The position of the mask alignment targets is measured by autocalibration detector or actinic light detector 14 when moved in position by wafer stage 12. Therefore, detection of both wafer and mask targets during a single alignment scan is not possible, and the relative positions of the wafer target detector 41 and the projection optics 16 image must remain stable between sequential measurements. This single off-axis viewpoint also requires that the wafer stage 12 have a high accuracy over a large range of travel and that optical magnification and systems skew be separately measured. The operation of this non-through the lens alignment system is controlled by control means 43.

While these and other prior alignment systems are adequate for their intended purposes, there is an ever increasing need for a simpler, more reliable, and more efficient optical alignment system for aligning a wafer and mask during manufacture of semiconductor chips.

SUMMARY OF THE INVENTION

The present invention provides a single channel alignment system that has an optical path partially on the optical axis of the projection optics. A wafer stage capable of holding a semiconductor wafer having wafer targets thereon and a mask stage capable of holding a mask having mask targets thereon are moved in parallel planes. Projection optics having an optical axis are placed between the wafer stage and the mask stage for projecting the image of the mask onto the wafer. The alignment channel having alignment optics and an illumination source is used to illuminate and detect the wafer targets. The illumination from the alignment channel may also be used to detect the mask targets. The optical path of the single channel alignment system is partially coincident with the optical axis of the projection optics. Thereby, a single channel on axis through the lens alignment system is obtained. The mask and wafer can thereby be simultaneously scanned by the alignment system and the mask and wafer alignment can be maintained during scanning and exposure. A control means is used for controlling the relative movement between the wafer and mask stage for maintaining alignment of the mask and wafer during scanning and exposure.

Accordingly, it is an object of the alignment system of the present invention to provide a simpler, more accurate alignment system for semiconductor lithography.

It is an advantage of the alignment system of the present invention that it does not have to be corrected for off-axis lateral color aberrations.

It is a further advantage of the alignment system of the present invention that the complexities of two movable alignment channels are avoided.

It is a feature of the alignment system of the present invention that a portion of the alignment illumination path is on the optical axis of the projection optics.

It is a further feature of the alignment system of the present invention that detection of both the wafer and mask alignment targets and scanning can occur during a single simultaneous scan of both the wafer and mask.

These and other objects, advantages, and features will become readily apparent in view of the following more detailed description.

DETAILED DESCRIPTION OF THE PREFERRED EMBODIMENTS

Figure 1:
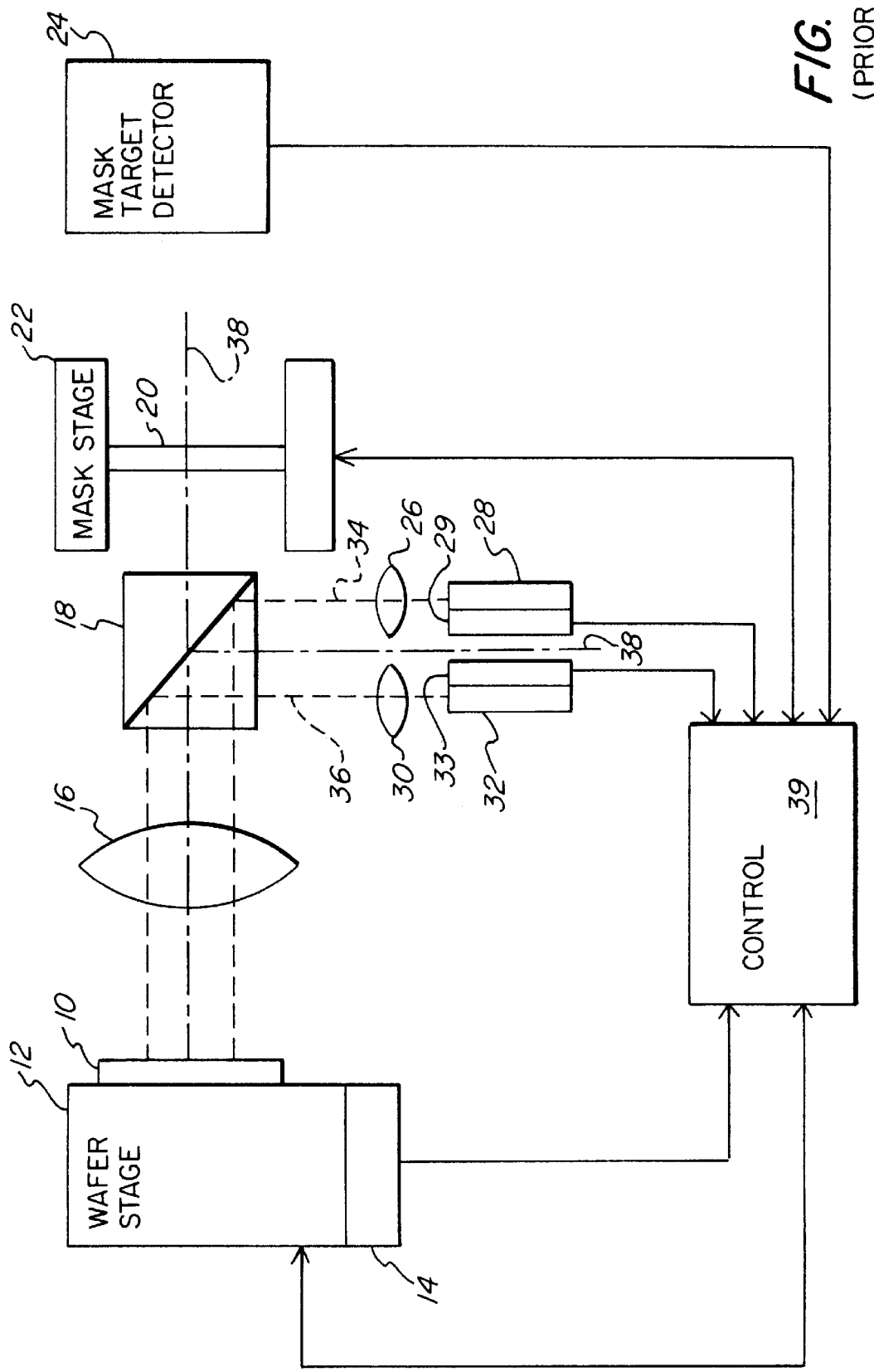
FIG. 1 is a schematic illustration of a prior art two channel off-axis optical alignment system.
Figure 2:
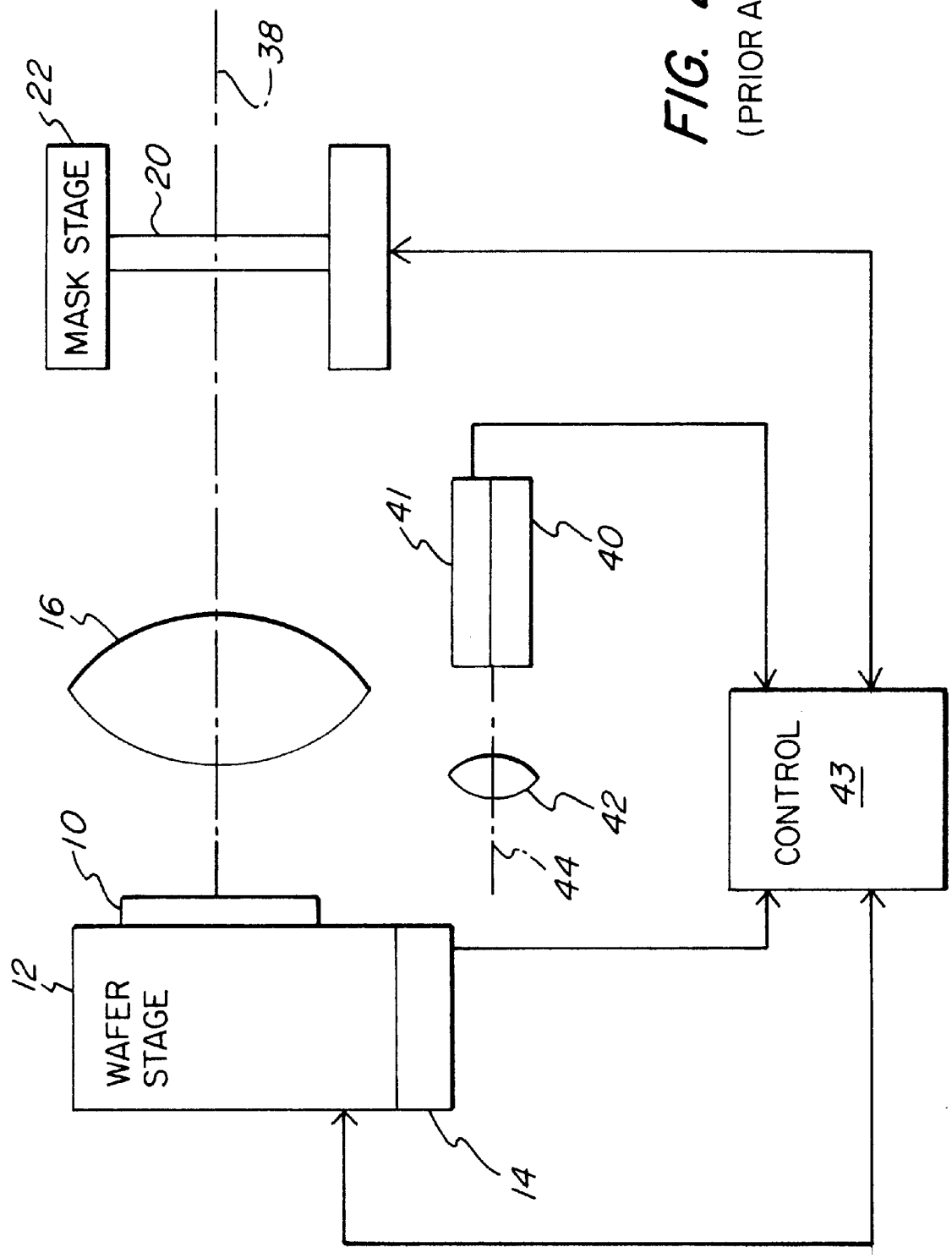
FIG. 2 is a schematic illustration of a prior art non-through e lens optical alignment system.
Figure 3:
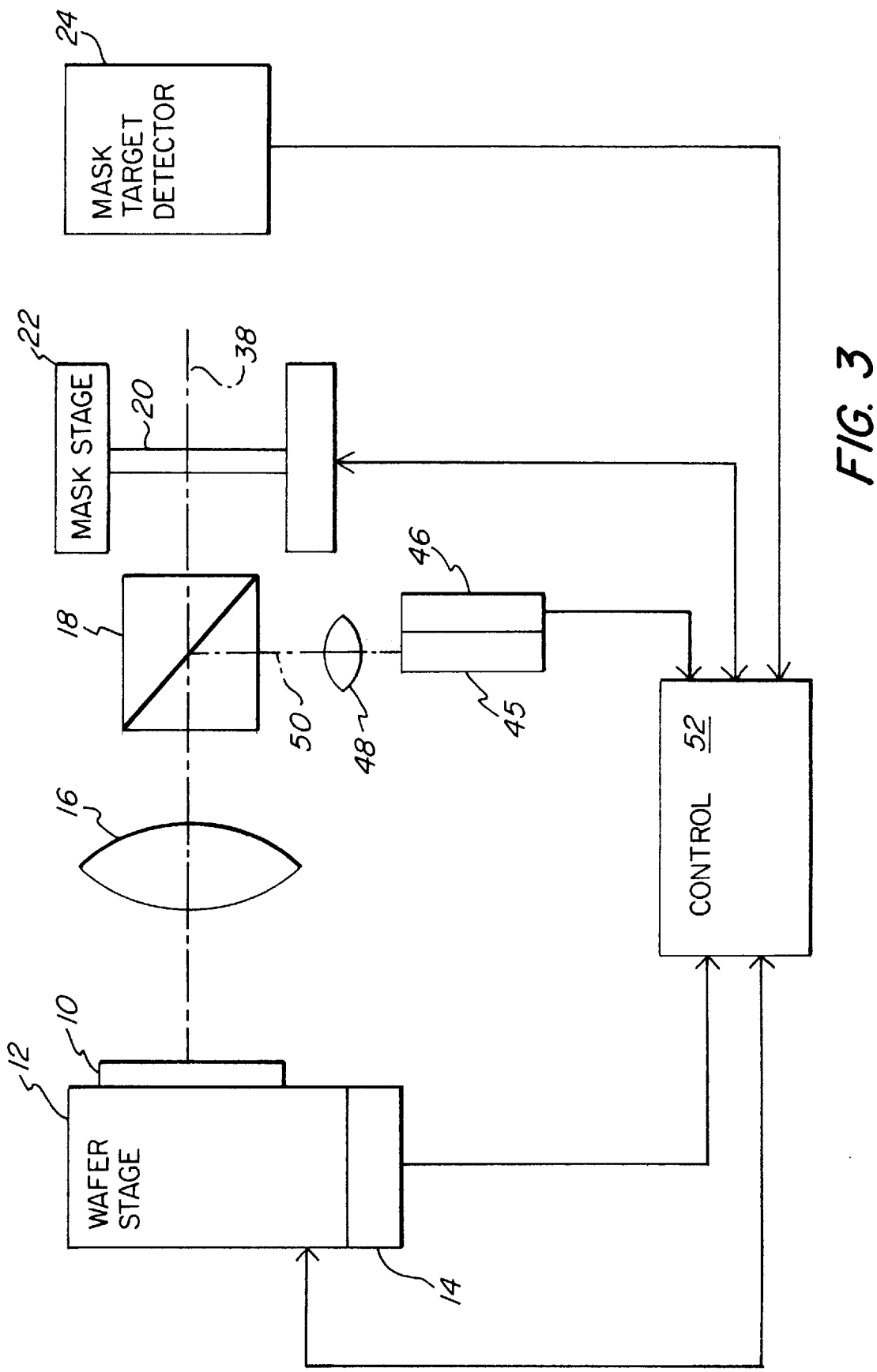
FIG. 3 is a schematic illustration of the optical alignment system of the present invention.

FIG. 3 discloses the optical alignment system of the present invention. In FIG. 3, wafer 10 is held by a wafer stage 12. Wafer stage 12 is capable of moving along two axes, X and Y, in a single plane. The wafer stage 12 can also move in rotation, or θ. Attached to wafer stage 12 is an autocalibration detector 14. The autocalibration detector 14 has primarily two functions. The first function is to detect the image of a mask target, and the second function is to provide a target for the alignment system to locate. Mask 20 is held by a mask stage 22. Mask stage 22 is capable of moving along a single axis in a plane parallel to the plane formed by the movement of wafer stage 12. Between the wafer 10 and the mask 20 are projection optics 16 and a beamsplitter 18. The projection optics 16 have an optical axis 38. The beamsplitter 18 is placed in the path of the optical axis 38. Associated with the beamsplitter 18 is a single optical alignment channel. The optical alignment channel comprises an illumination source 45, wafer target detector 46, and alignment optics 48. Wafer target detector 46 could be positioned elsewhere in the alignment system. The alignment optics 48 have an optical axis 50. A portion of the optical axis 50 coincides with a portion of the optical axis 38 of the projection optics 16. Behind the mask 20 is a mask target detector 24. The movement of the wafer stage 12 and mask stage 22 is controlled by control means 52. The control means 52 also receives signals from the autocalibration detector 14, the mask target detector 24, and the wafer detector 46. The control means 52 controls the relative movement of the wafer stage 12 and mask stage 22 according to the signals received from the autocalibration detector 14, the target detector 24, the wafer stage 12, the mask stage 22, and wafer target detector 46 for aligning the wafer 10 and mask 20.

The specific construction of the single channel alignment system may be similar to that disclosed in one of the channels or scan arms in U.S. Pat. No. 4,697,087. That is, it may be of the reverse dark field type or other known optical alignment system.

In operation, the illumination source 45 and wafer target detector 46 are used to detect targets located on the wafer during scanning. The alignment illumination is projected onto the wafer and reflected or scattered back through the projection optics 16 to the wafer target detector 46 and mask target detector 24. The alignment illumination may be in the visible light range. The alignment illumination has a path partially on the optical axis 38 of the projection optics 16. The mask target detector 24 operates on the axis of the projection optics and is used either to detect the position of wafer targets or both wafer and mask targets. However, in order to use an on axis target detector the mask must have targets at the center of the mask field. The mask targets can be positioned in the vertical kerf at the center of the field between circuit patterns. Therefore, only a small field of visible light corrected path is needed. Alternatively, the relative position between mask targets and selected wafer targets can be measured by the target detector 24 while both the wafer and mask are simultaneously scanned. The single viewpoint of the mask target detector 24 requires that optical magnification and system skew be measured by the autocalibration detector 14. However, the requirement for high accuracy wafer stage 12 movement is minimized. Optionally, mask targets may be measured by scanning the autocalibration detector 14 over the image of the mask targets while using exposure illumination, not shown, thereby detecting the relative position of mask targets and selected wafer targets during sequential scanning.

Therein, it can readily be appreciated that the single channel on axis through the lens optical alignment system of the present invention has many advantages over those of prior art alignment systems. For example, throughput is improved over non-through the lens systems by eliminating stage motion required to reposition the stage between sequential scans. Additionally, much of the stability advantages of having a partially common path with the actinic light or exposure illumination used to expose the wafer and the ability to simultaneously make relative mask to wafer alignment measurements is maintained without the added complexity of a two channel off-axis alignment system.

FIGS. 4, 6, 7 and 7A illustrates an embodiment of an optical apparatus 60 which can be used with the previously described on-axis wafer to mask alignment system depicted in FIG. 3. An argonion laser 11 emitting spectral lines at 488 nm and 515 nm can serve as an illumination source. One suitable laser is Model No. 85 manufactured by Lexel Laser Corporation.

In this embodiment, the laser 11 emits plane-polarized visible light which falls incident on a plane-parallel plate 59. The plate 59 has a chrome-plated surface which includes a mark, for example, an etched cross, which defines an object 61. The cross "x" is oriented so that its lines are in planes at 45° to the plane of FIG. 4 and intersect at the optical axis of the optical apparatus 60. The orientation can be explained by imagining that an x is lying on the plane of the page of FIG. 4 at plate 59 in the same orientation as the numbering and lettering. The x is then lifted off the page by holding the left-hand arms of the x on the page and lifting the right-hand arms by 90 degrees so that the latter arms are standing on the page. This is the orientation of the cross. The center of the x is then on the optical axis, so half the x is buried below the plane of the page in FIG. 4.

The entrance pupil of the optical apparatus 60 is set at infinity, and is imaged by a lens 62 to an aperture stop 63 which defines the numerical aperture of the optical apparatus 60. The numerical aperture (N.A.) is, by definition, the sine of the angle the marginal ray makes with the optical axis. This is followed by a cylindrical lens 64. An air-spaced lens doublet 65, 66 then relays the image of the object 61 to a field stop 68 by a partially-reflecting fold mirror 67 which renders the apparatus more compact for packaging. A fold mirror 69 then directs the light through an aberration-correcting lens 70, a tilted plane-parallel plate 71, a dichroic plate beamsplitter 72, after which it coincides with the optical axis of the ultraviolet (UV) projection optics system used to expose a wafer 89.

Examples of suitable UV projection optics systems are described in U.S. Pat. No. 4,953,960, entitled, Optical Reduction System, issuing Sep. 9, 1990 to David Williamson, and pending U.S. application Ser. No. 08/134,505, entitled, Catadioptric Optical Reduction System With High Numerical Aperture, each being hereby incorporated by reference. In one embodiment, the UV projection optics system comprises lens 73, 74, 75, 76, and a polarizing beamsplitter cube made of right angle prisms 77, 79, which are contacted together, hypotenuse-face-to-hypotenuse-face, with a dielectric multilayer coating surface 78 therebetween. A suitable coating for the surface 78 of the beamsplitter can be obtained from several well-known vendors of custom-designed coatings, such as O.C.L.I., Santa Rosa, Calif. or Rocky Mountain Instruments, Longmont, Colo.

The UV projection optics system uses s-polarized light which therefore reflects off the beamsplitter surface 78. In contrast, the visible light emanating from the laser 11 is p-polarized at the beamsplitter surface 78. Therefore, the light is mostly transmitted by the beamsplitter surface 78, to a visible zero-order quarter waveplate 80, to a spherical aberration correction lens 81, and a spherical concave mirror 82. The reflected light then returns through the refracting lens 81 and the quarter-waveplate 80 to the beamsplitter surface 78. However, because the light has now passed through the quarter-waveplate 80 twice, the light is s-polarized. Thus, the light is mostly reflected by the beamsplitter surface 78 and returns along the optical axis of the UV projection optics system to a refracting lens group comprising an UV zero-order quarter-waveplate 83, and then to lens 84, 85, 86, 87, and 88. Upon exiting from this refracting lens group, the light illuminates the surface of the wafer 89 with a small cross-shaped area centered on the optical axis of the UV projection optics system.

The optical apparatus 60 described provides a number of features and advantages. The tilted plane-parallel plate 71 reduces or cancels coma caused by the tilted plate dichroic beamsplitter 72. The cylindrical lens element 64 corrects for astigmatism caused by the plates 71 and 72. The lens 62, 65 and 66 act as a two-times reduction relay lens forming an intermediate image at field stop 68. The field stop 68 is conjugate with an image of a reticle 97 (FIG. 7) formed by the UV projection system's visible light path through the elements 80, 81, 82 which further reduce the object 61 by a factor of four. Thus, the final image at the wafer 89 is eight times smaller than the object 61. Mirror 82 is close to the pupil of the optical apparatus 60, that is, it is approximately conjugate with the aperture stop 63. The visible light beam illuminating the wafer 89 has a N.A. of 0.25, and the diameter of the cross-shaped field of view is 500 microns.

As shown below, Table 1 lists a prescription for an embodiment of the optical apparatus 60, including the radii, the thicknesses, the materials for the individual lens elements, and the dimensions and locations of the mirrors and the beamsplitter. For brevity, the surfaces of the elements listed in Tables 1–4 are designated with the following abbreviations: an infinite radius of curvature (INF), a flat shape (FLT), a curved surface is convex (CX), concave (CC), spherical (SPH), or cylindrical (CYL). The shape of apertures are designated as circular (CIR) or rectangular (REC). Suitable materials for the various lens are fused silica (SILICA) or optical grade glass which can be obtained from various well known manufacturers. For example, Heraeus amersil of Sayreville, N.J. and Corning Glass Works of Corning, N.Y., manufacture fused silica glass; Schott Optical Glass of Duryea, Pa. manufactures optical glass designation BK7 (glass column in the tables); and Ohara Optical Glass of Somerville, N.J. also supplies the glass designation BSM16C (Table 1 element 65); which are suitable materials for the elements indicated in the Tables 1–4.

TABLE 1

| ELEMENT NO. | SURFACE NO. | SURFACE DESCRIPTION RADIUS | SHAPE | THICKNESS OR SEPARATION (mm) | APERTURE DESCRIPTION DIMENSION X Y (mm) | SHAPE | MATERIAL |
|---|---|---|---|---|---|---|---|
| 61 | OBJECT | INF | FLT | 0.0000 | | | |
| 61 | 1 | INF | FLT | 2.5000 | 4.000 | CIR | |
| 61 | 2 | INF | FLT | 31.2669 | 4.103 | CIR | |
| 62 | 3 | 59.503 | CX SPH | 8.0000 | 6.063 | CIR | BK7 |
| 62 | 4 | INF | FLT | 108.8600 | 6.111 | CIR | |
| 63 | Pupil Stop | | | 4.8360 | 7.350 | | |
| 64 | 5 | INF | FLT | 8.0000 | 7.524 | CIR | BK7 |
| 64 | 6 | −316.741 | CX CYL | 51.2831 | 7.942 | CIR | |
| 65 | 7 | INF | FLT | 6.0000 | 12.023 | CIR | BSM16C |
| 65 | 8 | −23.700 | CX SPH | 2.7672 | 12.277 | CIR | |
| 66 | 9 | −20.090 | CC SPH | 4.0000 | 11.560 | CIR | PBH4 |
| 66 | 10 | −30.314 | CX SPH | 25.0000 | 12.055 | CIR | |
| 67 | 11 | INF | FLT | −66.2480 | 12.764 | CIR | REFL |
| 68 | Field Stop | | | −86.8765 | 2.000 | | |
| 69 | 12 | INF | FLT | 50.0000 | 17.480 | CIR | REFL |
| 70 | 13 | −63.448 | CC SPH | 13.1764 | 18.063 | CIR | |
| 70 | 14 | −57.496 | CX SPH | 152.2223 | 20.257 | CIR | |
| 71 | 15 | INF | FLT | 42.4242 | 84.000 126.000 | REC | SILICA |
| 71 | 16 | INF | FLT | 70.0000 | 84.000 126.000 | REC | |
| 72 | 17 | INF | FLT | 42.4242 | 140.000 144.000 | REC | SILICA |
| 72 | 18 | INF | FLT | 69.3746 | 140.000 144.000 | REC | |
| 73 | 19 | 233.606 | CX SPH | 33.7272 | 173.766 | CIR | SILICA |
| 73 | 20 | −762.618 | CX SPH | 30.1563 | 170.254 | CIR | |
| 74 | 21 | −372.060 | CC SPH | 11.8800 | 154.966 | CIR | SILICA |
| 74 | 22 | 183.034 | CC SPH | 8.2372 | 147.388 | CIR | |
| 75 | 23 | 236.499 | CX SPH | 30.1726 | 147.948 | CIR | SILICA |
| 75 | 24 | −601.730 | CX SPH | 6.1432 | 145.994 | CIR | |
| 76 | 25 | 478.820 | CX SPH | 11.8800 | 140.566 | CIR | SILICA |
| 76 | 26 | 129.986 | CC SPH | 27.1490 | 132.422 | CIR | |
| 77 | 27 | INF | FLT | 71.2800 | 142.560 142.560 | REC | SILICA |
| 78 | 28 | INF | FLT | 0.0000 | 53.351 | CIR | |
| 78 | 28 | INF | FLT | 71.2800 | 53.351 | CIR | SILICA |
| 79 | 29 | INF | FLT | 2.0000 | 142.560 142.560 | REC | |
| 80 | 31 | INF | FLT | 10.0000 | 59.276 | CIR | BK7 |
| 80 | 32 | INF | FLT | 8.9940 | 60.059 | CIR | |
| 81 | 33 | −97.941 | CC SPH | 5.0382 | 60.567 | CIR | SILICA |
| 81 | 34 | −97.548 | CX SPH | 2.5000 | 61.935 | CIR | |
| 82 | 35 | −327.218 | CC SPH | −2.5000 | 62.615 | CIR | REFL |
| 81 | 36 | −97.548 | CX SPH | −5.0382 | 61.009 | CIR | SILICA |
| 81 | 37 | −97.941 | CC SPH | −8.9940 | 59.159 | CIR | |
| 80 | 38 | INF | FLT | −10.0000 | 57.906 | CIR | |
| 80 | 39 | INF | FLT | −2.0000 | 56.054 | CIR | |
| 79 | 40 | INF | FLT | −71.2800 | 142.560 142.560 | REC | SILICA |
| 78 | 41 | INF | FLT | 60.4000 | 201.580 142.560 | REC | REFL |
| 79 | 42 | INF | FLT | 1.9800 | 142.560 142.560 | REC | |
| 83 | 43 | INF | FLT | 4.4550 | 96.507 | CIR | SILICA |
| 83 | 44 | INF | FLT | 1.1880 | 95.382 | CIR | |
| 84 | 45 | 139.982 | CX SPH | 12.9618 | 91.934 | CIR | SILICA |
| 84 | 46 | 4972.000 | CC SPH | 1.1880 | 89.302 | CIR | |
| 85 | 47 | 96.497 | CX SPH | 18.3356 | 81.718 | CIR | SILICA |
| 85 | 48 | 491.665 | CC SPH | 1.1880 | 73.084 | CIR | |
| 86 | 49 | 138.503 | CX SPH | 15.3530 | 68.032 | CIR | SILICA |
| 86 | 50 | 76.880 | CC SPH | 2.9394 | 52.783 | CIR | |
| 87 | 51 | 137.200 | CX SPH | 18.6846 | 51.962 | CIR | SILICA |
| 87 | 52 | 547.846 | CC SPH | 0.1980 | 38.194 | CIR | |
| 88 | 53 | 141.008 | CX SPH | 6.0885 | 36.750 | CIR | SILICA |
| 88 | 54 | 291.430 | CC SPH | 4.0000 | 31.846 | CIR | |
| 89 | IMAGE | INF | FLT | | 0.503 | | |

Figure 5:
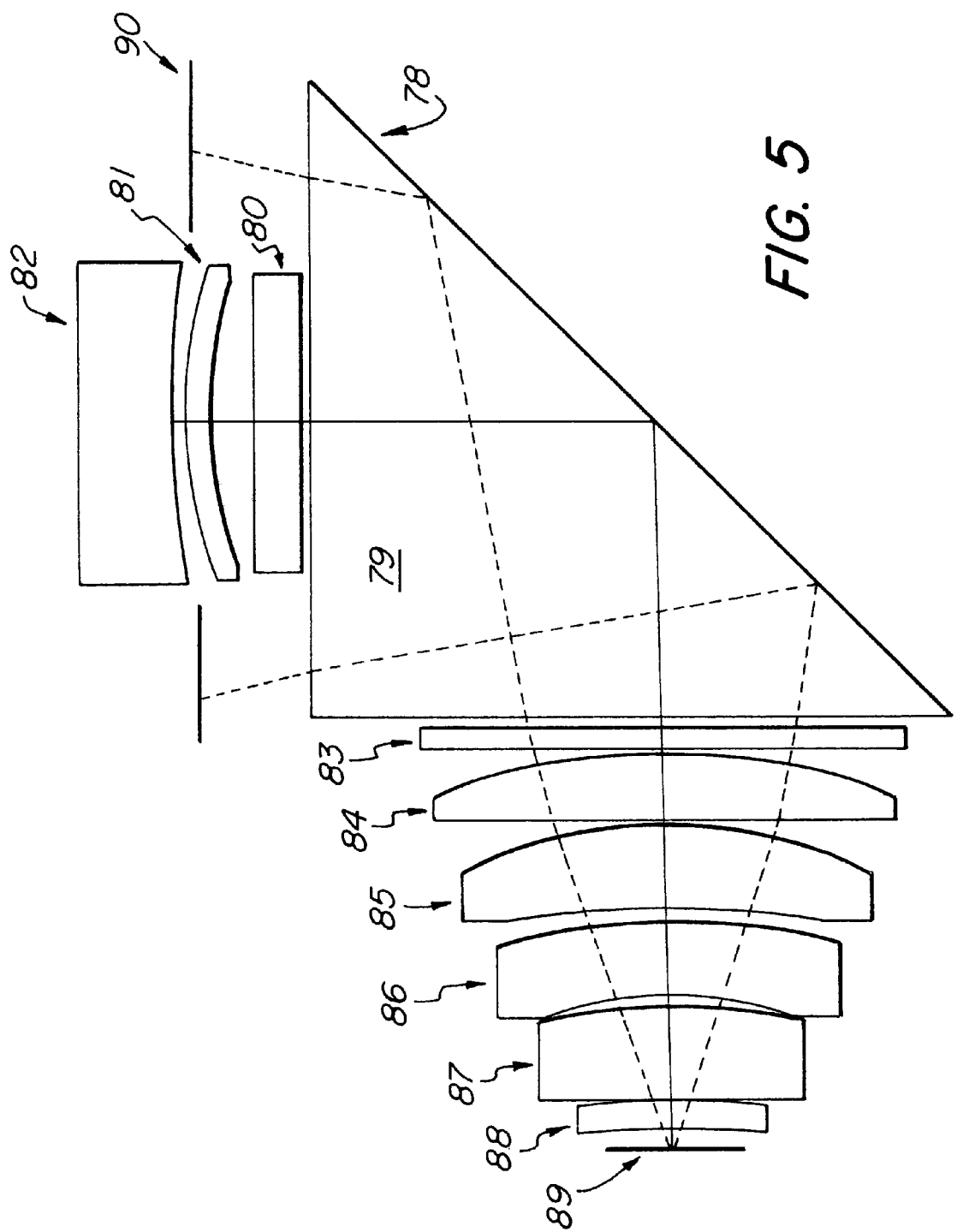
FIG. 5 illustrates wafer alignment mark scattering of eight in the reversed-dark field optical path.

FIG. 5 illustrates that when a wafer alignment mark scatters visible light some of the resulting paths will be at angles greater than the N.A. of the visible illumination system but nevertheless less than the N.A. of the UV projection system. Light falling in this range is referred to as in the "dark field" or, more properly, "reversed dark-field" because it has the opposite effect of the illumination technique used in dark-field microscopy. In the embodiment illustrated in FIG. 5, the alignment illumination system N.A. is 0.25 and projection optics system N.A. is 0.6.

FIG. 5 illustrates visible light rays corresponding to a N.A. of 0.6 as they leave the wafer 89 and pass through the UV projection optics system lens 88, 87, 86, 85, 84 and UV quarter-waveplate 83. Because the wavelength of visible light is approximately double that of the radiation in the UV region, the UV quarter-wave plate 83 functions as an eighth-waveplate for visible light. Thus, the s-polarized visible light incident on the wafer 89 is converted to approximately circularly polarized light after two passages through the UV quarter waveplate 83. When such light is incident again on the beamsplitter surface 78 of the beamsplitter cube 77, 79, a proportion of the light is reflected from the surface 78 and leaves the prism 79 outside the clear aperture of the visible elements 80, 81 and 82. Four detectors are preferably placed in a location 90, which is close to the pupil of the system, and corresponds to the direction of light scattered from the two arms of the wafer alignment cross at 45 degrees to the plane of FIGS. 4 and 5.

Table 2 lists a suitable optical prescription for the elements between the prism 79 and the detector(s) at location 90 outside of lens 80, 81 and 82.

TABLE 2

| ELEMENT NUMBER | RADIUS OF CURVATURE | | THICKNESS (mm) | APERTURE DIAMETER | |
|---|---|---|---|---|---|
| | FRONT | BACK | | FRONT | BACK |
| 79 | INF | INF | 23.880 | | |
| 90 | INF | | | 142.56 | |

Figure 6:
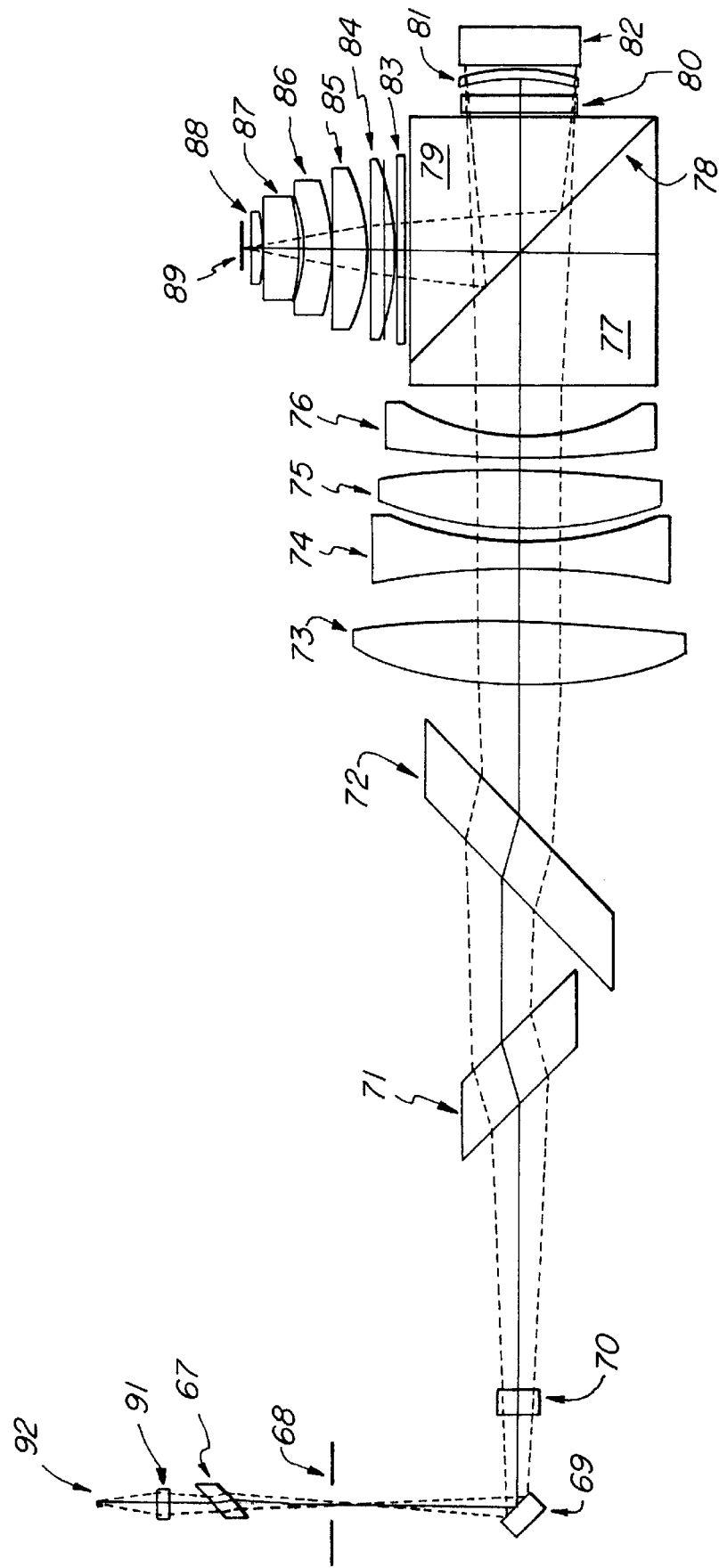
FIG. 6 illustrates a wafer alignment mark scattering the light in angles which are less than an illumination system having a numerical aperture of 0.25.

FIG. 6 illustrates one embodiment where the path for light scattered from an alignment mark at the wafer 89 is at angles less than the illumination system N.A. of 0.25. The light travels through the optical apparatus 60 in reverse sequence, namely, first through lens 88, 87, 86, 85, 84, the quarter waveplate 83, the prism 79, the surface 78, the prism 79, the quarter waveplate 80, lens 81, mirror 82, lens 81, quarter waveplate 80, the prism 79, the surface 78, the prism 77, the lens 76, 75, 74, 73, and exits the UV projection optics system through the dichroic beamsplitter 72, and from there to the tilted plate 71, the lens 70, and the mirror 69. The light then passes through a field stop 68 at an intermediate image plane. The field stop 68 blocks any defocused ghost images from light reflected by any refracting surfaces between the field stop 68 and the wafer 89. Approximately 10% of the light intensity is transmitted by the partially reflecting mirror 67, and passes through a single lens 91 which forms an image of the optical apparatus's pupil at a detector plane 92. A detector (not shown) is disposed in the detector plane 92 to receive the so-called bright field signal from an alignment mark on the wafer 89. Suitable detectors include Hamamatsu S-3590-01 Reverse Dark Field Signal Detectors and Hamamatsu S-3071 Brief Field Wafer Signal Detectors. Although rarely needed, this bright field signal can be used when the alignment mark on wafer 89 is not clearly visible in the dark-field system, such as when the mark is applied on top of a very rough, grainy metallic substrate.

Table 3 provides a prescription for optical elements arranged between the partially reflecting mirror 67 and the detector plane 92.

TABLE 3

| ELEMENT NUMBER | RADIUS OF CURVATURE | | THICKNESS (mm) | APERTURE DIAMETER | | GLASS |
|---|---|---|---|---|---|---|
| | FRONT (mm) | BACK (mm) | | FRONT | BACK | |
| 67 | INF | INF | −11.3120 −21.2462 | 12.7797 | 19.6456 | BK7 |
| 91 | −20.0900 CX | INF | −8.0000 −33.1727 | 12.6385 | 11.548 | BK7 |
| 92 | INF | | | 4.0875 | | |

Figure 7:
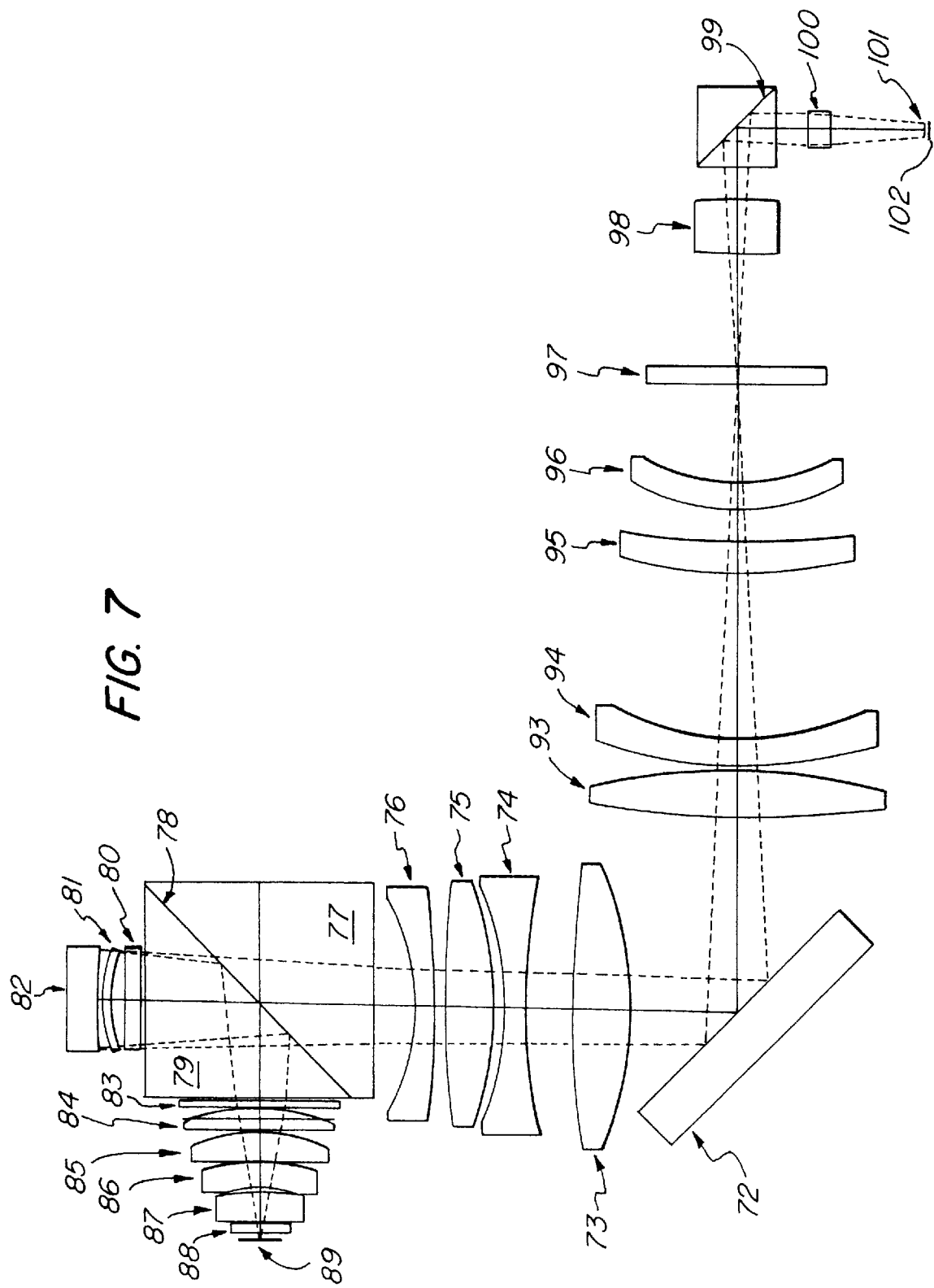
FIG. 7 illustrates a path for visible illumination light speculatory reflected from the wafer, and used to back-illuminate the reticle and thereby generate a signal to determine its position relative to the wafer alignment mark.

FIG. 7 shows the path of visible illumination light that is speculatory reflected from the surface of the wafer 89, and then used to back-illuminate the reticle 97 (FIG. 7) and thereby generate a signal to determine its position relative to the alignment mark on wafer 89. This light follows the same path through the lens 88, 87, 86, 85, 84, the quarter-waveplate 83, the prism 79, the surface 78, the prism 79, the elements 80, 81, the mirror 82, the elements 81, 80, the prism 79, the surface 78, the prism 77, the lens 76, 75, 74, and 73. However, a proportion of the intensity of the light is reflected by a dielectric-multilayer-coated surface on the tilted plane-parallel plate 72, to remain in the UV projection optics system path through lens 93, 94, 95 and 96 to the reticle 97. A suitable coating for the dielectric-multilayer-coated surface can be obtained from several well-known vendors of custom-designed coatings, such as O.C.L.I., Santa Rosa, Calif. or Rocky Mountain Instruments, Longmont, Colo. The light illuminates a clear area in the chrome of the reticle 97, passing through the reticle 97 into the UV illumination system's lens 98, before being reflected out of the UV illumination system's path by a dichroic beamsplitter 99. From there a lens 100 forms a real exit pupil at plane 101, wherein is placed a detector 102 for a reticle signal, such as Hamamatsu S-3071 Reticle Signal Detetors.

Table 4 shows the optical prescription between elements 72 and 101.

TABLE 4

| ELEMENT NUMBER | RADIUS OF CURVATURE FRONT | RADIUS OF CURVATURE BACK | THICKNESS Element/Air | APERTURE DIAMETER FRONT | APERTURE DIAMETER BACK | GLASS |
|---|---|---|---|---|---|---|
| 72 | INF | INF | −119.4669 | 176.7540 | | REFL |
| 93 | −627.0100 CX | 417.6020 CX | −28.7417 −2.9700 | 181.1260 | 180.1980 | SILICA |
| 94 | −265.3000 CX | −177.6830 CC | −17.5000 −101.8882 | 170.7900 | 160.4620 | SILICA |
| 95 | −290.3110 CX | 446.2740 CC | −19.1566 −19.9011 | 142.6540 | 137.9940 | SILICA |
| 96 | −132.9850 CX | −126.7060 CC | −16.8300 −62.7159 | 128.9160 | 120.4225 | SILICA |
| 97 | INF | INF | −10.0000 −70.0000 | 110.0000 | 110.0000 | SILICA |
| 98 | −448.3027 CX | 200.4730 CX | −35.4500 −20.0000 | 50.0000 | 50.0000 | SILICA |
| 99 | INF | INF | −25.0000 | 50.0000 | 70.7000 | SILICA |
| 99 | INF | INF | 25.0000 20.0000 | 70.7000 | 50.0000 | REFL |
| 100 | 50.0000 CX | INF | 15.0000 59.1645 | 20.4501 | 19.1901 | BK7 |
| 101 | INF | | | 11.1000 | | |

Figure 4:
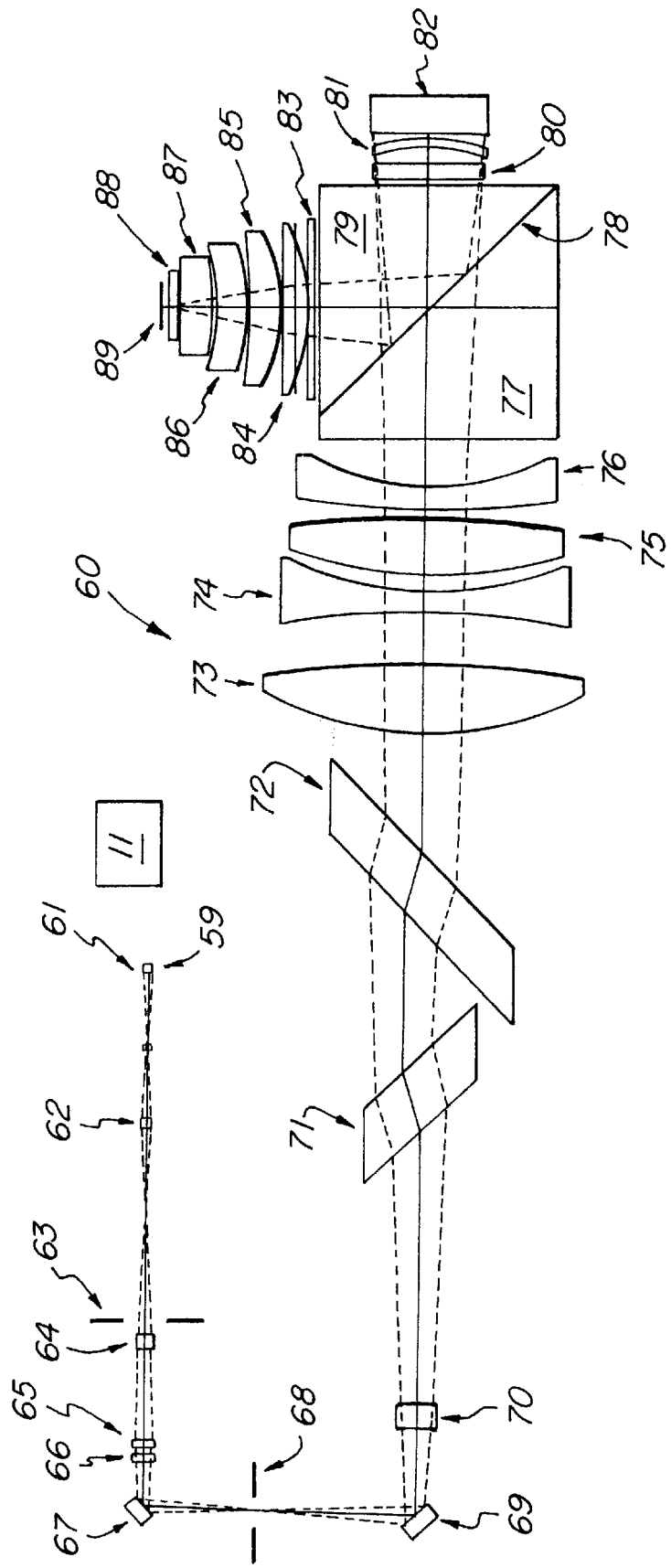
FIG. 4 illustrates an embodiment of an optical apparatus which can be used in an on-axis alignment illumination mask and wafer alignment system.
Figure 7A:
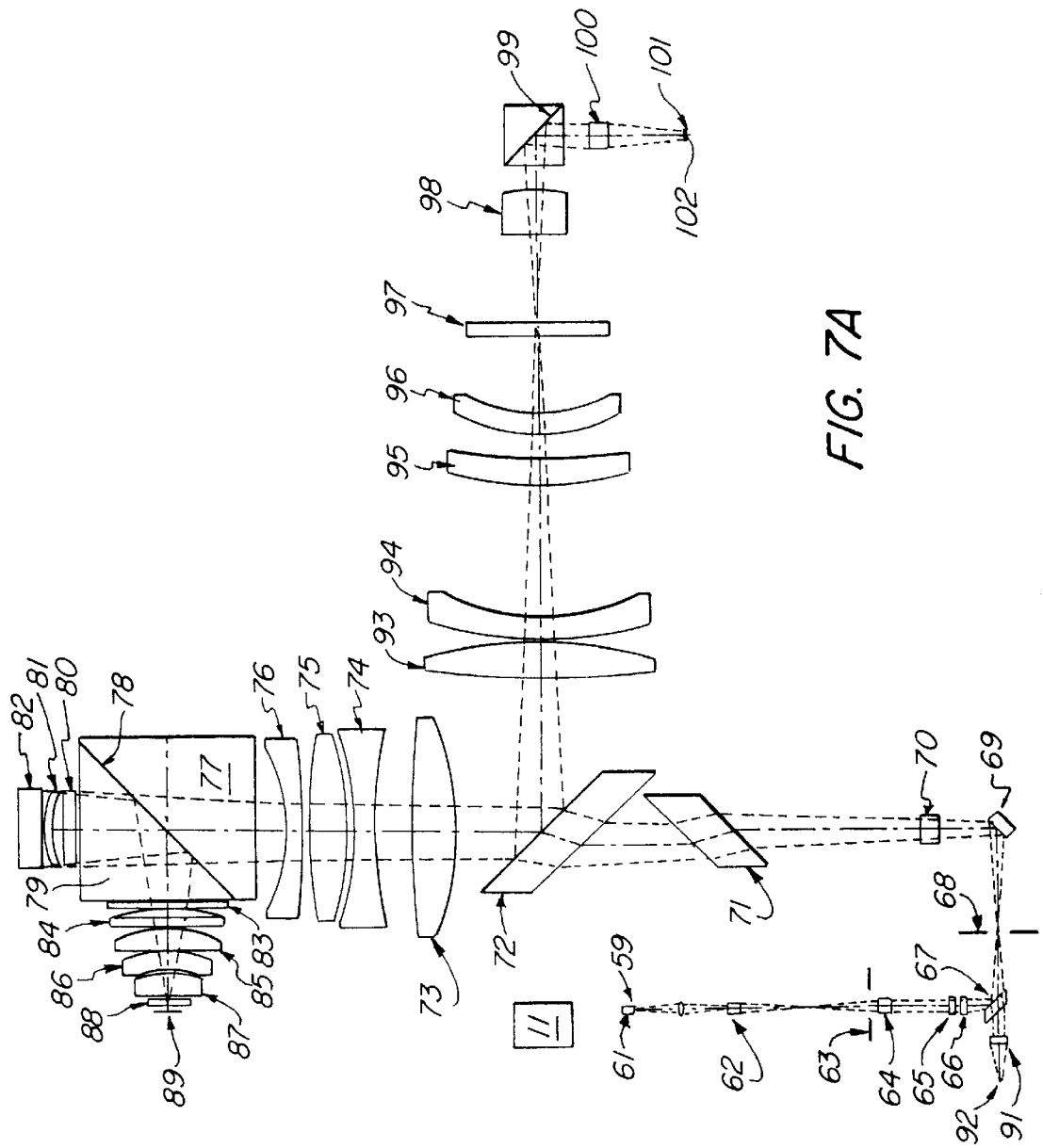
FIG. 7A illustrates the combined optical system from FIGS. 4, 6 and 7.

FIG. 7A more conveniently illustrates in one figure the combined optical system from FIGS. 4, 6, and 7.

While several embodiments have been illustrated and described, it should be clear that various modifications may be made without departing from the spirit and scope of this invention.

What is claimed is:

1. An alignment system for use in aligning a mask and wafer in lithography comprising:

a wafer stage movable in a first plane;

a wafer placed on said wafer stage, said wafer having wafer targets thereon;

a mask stage movable in a second plane, the first and second planes being substantially parallel;

a mask placed on said mask stage, said mask having mask targets thereon;

projection optics positioned between said wafer stage and said mask stage, said projection optics having an optical axis;

a beamsplitter placed in the path of the optical axis of said projection optics;

a source of alignment illumination, the alignment illumination having a path a portion of which is on said optical axis;

alignment optics capable of projecting the alignment illumination on the mask and wafer targets, said alignment optics including a tilted plate dichroic beamsplitter, a tilted plane-parallel plate, and a cylindrical lens;

wafer target detector means for detecting the wafer targets;

mask target detector means for detecting the mask targets; and control means, coupled to said wafer stage, said mask stage, said wafer target detector means, and said mask target detector means, for controlling the relative movement between said mask and said wafer, whereby the mask and wafer are aligned.

2. An alignment system as in claim 1 wherein said mask target detector means are on the optical axis of said projection optics.

3. An alignment system as in claim 1 wherein said mask target detector means are attached to said wafer stage.

4. An alignment system as in claim 1 wherein said source of alignment illumination produces light in the visible range.

5. An alignment system as in claim 1 wherein said alignment optics produce a reverse dark field image.

6. An alignment system for use in aligning a mask and wafer in lithography comprising:

a wafer stage movable in a first plane;

a mask stage movable in a second plane, said first and second planes being substantially parallel;

projection optics positioned between said wafer stage and said mask stage, said projection optics having an optical axis;

a beamsplitter placed in the path of the optical axis of said projection optics;

a source of alignment illumination, the alignment illumination having a path a portion of which is on said optical axis;

alignment optics capable of projecting a portion of the alignment illumination on the wafer, said alignment optics comprising, from said source of alignment illumination, a plane-parallel plate with a transparent cross etched on its chrome-plated surface, a reduction relay system, an aberration-correcting lens group, a tilted plane-parallel plate, a dichroic plate beamsplitter, and said projection optics whose optical axis coincides with the cross on the plane-parallel plate, the reduction relay and aberration-correcting lens group;

first detector means, associated with said source of alignment illumination, for detecting illumination reflected from the wafer;

second detector means for detecting a portion of the mask; and control means, coupled to said wafer stage, said mask stage, said first detector means, and said second detector means, for controlling the relative movement between said wafer stage and said mask stage, whereby the mask and wafer are aligned.

7. An alignment system as in claim 6 further comprising means for detecting light reflected at angles less than a numerical aperture of said projection optics; and means for detecting light reflected at angles greater than a numerical aperture of said alignment optics.

8. An alignment system as in claim 6 wherein said first detector means comprises, from the wafer:
   a portion of said projection optics;
   said dichroic plate beamsplitter;
   said aberration-correcting lens group;
   a field stop;
   a partially reflecting mirror;
   a lens; and
   a detector placed at a plane conjugate with a pupil of said projection optics.

9. An alignment system as in claim 6 wherein said second detector means comprises:
   said projection optics;
   said beamsplitter within said projection optics; and
   detectors placed at a plane conjugate with a pupil plane.

10. An alignment system for use in aligning a mask and wafer in photolithography comprising:
    a wafer stage movable in a first plane;
    a mask stage movable in a second plane, said first and second planes being substantially parallel;
    projection optics positioned between said wafer stage and said mask stage, said projection optics having a projection optical axis;
    a beamsplitter placed in the path of the projection optical axis;
    a source of alignment illumination, the alignment illumination having a path a portion of which is on the projection optical axis;
    alignment optics capable of projecting a portion of the alignment illumination on the wafer, said alignment optics including a reduction relay lens, an aberration-correcting lens group, and a tilted plane-parallel plate, said alignment optics having an alignment optical axis intersecting said projection optical axis;
    a dichroic plate beamsplitter, said dichroic plate beamsplitter placed at the intersection of the alignment optical axis and the projection optical axis;
    first detector means, associated with said source of alignment illumination, for detecting illumination reflected from the wafer;
    second detector means for detecting a portion of the mask; and
    control means, coupled to said wafer stage, said mask stage, said first detector means, and said second detector means, for controlling the relative movement between said wafer stage and said mask stage, whereby the mask and wafer are aligned.

11. An alignment system for use in aligning a mask and wafer in photolithography as in claim 10 wherein:
    said projection optics are ultraviolet projection optics; and
    said source of alignment illumination provides light in the visible wavelength range.

12. An alignment system for use in aligning a mask and wafer in photolithography as in claim 11 further comprising:
    a plane-parallel plate following said dichroic plate beamsplitter.

13. An optical alignment system for use in aligning a mask and a wafer as used in scanning photolithography comprising:
    a wafer plane;
    a first portion of projection optics placed adjacent said wafer plane, said first portion of projection optics having a projection optical axis and a projection numerical aperture;
    a dichroic beamsplitter placed adjacent said first portion of projection optics;
    a second portion of projection optics positioned to receive electromagnetic radiation from said dichroic beamsplitter;
    alignment optics having an alignment optical axis and an alignment numerical aperture, a portion of the alignment optical axis coinciding with a portion of the projection optical axis and positioned to provide electromagnetic radiation to said dichroic beamsplitter, said alignment optics comprising a tilted plane parallel plate, an aberration correcting lens, and a cylindrical lens;
    an alignment illumination source providing electromagnetic radiation to said alignment optics; and
    a reticle plane positioned adjacent said second portion of projection optics,
    whereby the alignment optical axis is partially coincident with the projection optical axis permitting alignment of a mask and wafer to be maintained during scanning and exposure.

14. An optical alignment system as in claim 13 wherein:
    said first and second portions of projection optics are ultraviolet projection optics; and
    said alignment illumination source provides light in the visible wavelength range.

15. An optical alignment system as in claim 13 wherein:
    the projection numerical aperture is greater than the alignment numerical aperture.

16. An optical alignment system as in claim 13 wherein said alignment optics further comprises:
    a plane-parallel plate with a transparent cross etched on a chrome-plated surface adjacent said alignment illumination source; and
    an air spaced doublet relay positioned between said plane-parallel plate and said dichroic beamsplitter.

17. An optical alignment system for use in aligning a mask and a wafer as used in scanning photolithography comprising:
    a wafer plane (89);
    a first projection optic lens group (88, 87, 86, 85, 84) placed adjacent said wafer plane;
    a UV quarter wave plate (83) placed adjacent said first projection optic lens group;
    a first beamsplitter (77, 79) placed adjacent said UV quarter wave plate;
    a visible quarter waveplate (80) placed adjacent a first surface of said beamsplitter;
    a lens (81) placed adjacent said visible quarter waveplate;
    a mirror (82) placed adjacent said lens;
    a second projection optic lens group (73, 74, 75, 76) placed adjacent a second surface of said beamsplitter, the second surface opposite the first surface;
    a dichroic beamsplitter (72) placed adjacent said second projection optic lens group, said dichroic beamsplitter splitting electromagnetic radiation into a reflected portion and a transmitted portion;
    a third projection optic lens group (93, 94, 95, 96) positioned adjacent said dichroic beamsplitter and positioned to receive the reflected portion of electromagnetic radiation;

a reticle (97) adjacent said third projection optic lens group;

a reticle detector (102) positioned to receive electromagnetic radiation transmitted through said reticle;

a tilted plane parallel plate (71) positioned adjacent said dichroic beamsplitter and positioned to receive the transmitted portion of electromagnetic radiation;

an aberration correcting lens (70) placed adjacent said tilted plane parallel plate;

a partially reflecting mirror (67) positioned to receive electromagnetic radiation from said aberration correcting lens;

a detector plane (92) positioned to receive transmitted electromagnetic radiation from said partially reflecting mirror, said detector plane receiving electromagnetic radiation reflected from a wafer;

an alignment lens group (62, 64, 65, 66) positioned adjacent said partially reflecting mirror; and an alignment illumination source (11) adjacent said alignment lens group, whereby alignment illumination from said alignment illumination source coincides with a portion of an optical axis of said first, second, and third projection optics lens groups.

* * * * *